(12) United States Patent
Chou et al.

(10) Patent No.: US 7,016,277 B2
(45) Date of Patent: Mar. 21, 2006

(54) METHOD AND DEVICE FOR GENERATING A WRITE CLOCK OF A CONSTANT ANGULAR VELOCITY OPTICAL DISK DEVICE

(75) Inventors: Su-Hong Chou, Taipei Hsien (TW); Chih-Yang Liaw, Taipei Hsien (TW)

(73) Assignee: VIA Technologies Inc., Hsin-Tien (TW)

( * ) Notice: Subject to any disclaimer, the term of this patent is extended or adjusted under 35 U.S.C. 154(b) by 614 days.

(21) Appl. No.: 10/248,443

(22) Filed: Jan. 21, 2003

(65) Prior Publication Data

US 2003/0169656 A1    Sep. 11, 2003

(30) Foreign Application Priority Data

Mar. 8, 2002    (TW) ............................... 91104432 A (51) Int. Cl.
*G11B 7/60*    (2006.01)
(52) U.S. Cl. ................... 369/47.28; 369/53.34
(58) Field of Classification Search ............ 369/47.28, 369/53.34, 47.1, 53.36
See application file for complete search history.

(56) References Cited

U.S. PATENT DOCUMENTS 5,172,357 A  *  12/1992  Taguchi .................. 369/47.28

* cited by examiner

*Primary Examiner*—Nabil Hindi
(74) *Attorney, Agent, or Firm*—Winston Hsu

(57) ABSTRACT

A method for generating a write clock of a constant angular velocity compact storage device and the device thereof. The compact storage device has a counter for generating a count number by a reference clock counting a wobble signal, and a phase detector for generating an adjustment value by comparing a phase shift between an ATIP synchronization signal and an encoded subcode frame synchronization signal. According to the count number and the adjustment value, a rectification value is found, and the rectification value and the reference clock is used for generating a reference write clock to modify the encoded subcode frame synchronization signal. If the phase shift between an ATIP synchronization signal and an encoded subcode frame synchronization signal is smaller than a predetermined value, the reference write clock is the write clock used by the compact storage device.

21 Claims, 6 Drawing Sheets

METHOD AND DEVICE FOR GENERATING A WRITE CLOCK OF A CONSTANT ANGULAR VELOCITY OPTICAL DISK DEVICE

BACKGROUND OF INVENTION

1. Field of the Invention

The present invention relates to a method for generating a write clock of a constant angular velocity optical storage device, and more particularly, to a method that uses a wobble signal to generate a write clock of a constant angular velocity mode optical disk recorder.

2. Description of the Prior Art

For companies or the end users, the management and storage of documents is regarded as an important task. In the past, documents were printed or written on paper. Therefore, when a user deals with a huge amount of documents, it is not convenient for the user to manage those documents because of a great size or a heavy weight. With the development of computer technology, digital data and digital documents are widely stored in a plurality of data storage media. Many kinds of data storage media are developed to help users with those digital data conveniently. An optical disk recorder such as a CD-RW drive takes advantage of recordable compact disks to record data. The compact disk has a low production cost, a small size, and a great storage capacity.

Generally speaking, the optical storage device has two operation modes according to the mode of the motor control. One is a constant linear velocity (CLV) mode, and the other is a constant angular velocity (CAV) mode. With improvements in access speed, constant linear velocity mode is not suitable for a high efficiency or a high resolution application. The reasons are as follows. Under the constant linear velocity mode, the rotational speed of a spindle varies constantly in order to make the associated linear velocity at each position of a disk constant. The rotational speed of the spindle is increased and decreased alternately so that associated power dissipation is raised. The optical storage device, therefore, will suffer a high temperature, a great deal of vibration, and a slow access speed while operating. Therefore, is hard to improve the access speed under the constant linear velocity mode. On the contrary, the rotational speed of the spindle is fixed under the constant angular velocity mode. In other words, the rotation speed of the spindle is fixed, and the associated linear velocity at each position of the disk varies when the optical storage device accesses data from the disk. In addition, when an optical disk recorder under a constant linear velocity mode wants to burn data into the disk, the optical disk recorder cannot record data with a high recording speed because the limitation of keeping a constant linear velocity will prevent the spindle from having a high rotational speed. However, if the constant angular velocity mode is adopted, the spindle operates with a fixed angular velocity so that the outer circle of the disk has a greater linear velocity to improve the corresponding recording speed.

Figure 1:
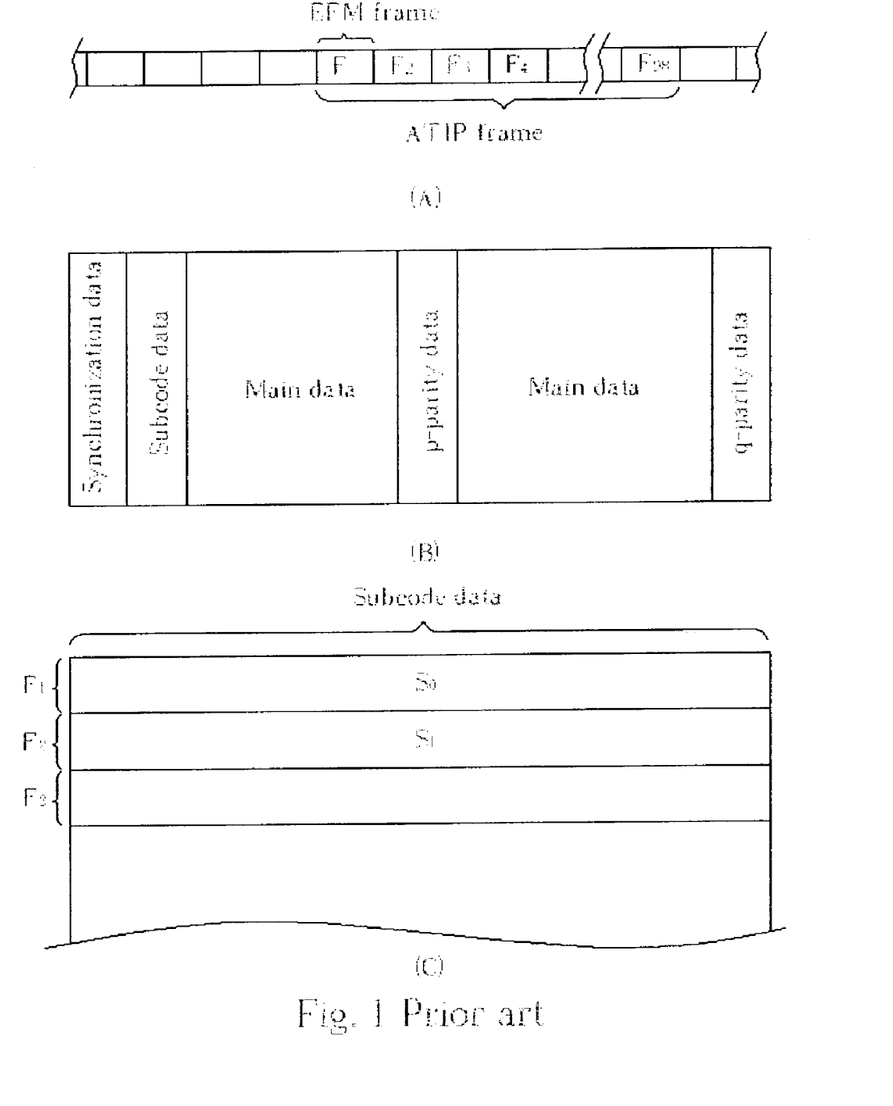
FIG. 1 is a diagram of recording frames according to a prior art disk.

Please refer to FIG. 1, which is a diagram of recording frames according to a prior art disk. The data are first transferred into corresponding eight-to-fourteen modulation (EFM) data when being recorded on a disk. The EFM data are recorded on the disk according to EFM frame format. As shown in FIG. 1A, every 98 EFM frames are combined together to form an absolute time in pre-groove (ATIP) frame. As shown in FIG. 1B, each EFM frame has 588 bits, and the EFM frame comprises synchronization data, subcode data, main data, p-parity data, and q-parity data. The main data, p-parity data, and q-parity data within the 98 EFM frames (ATIP frame) are combined to form a main channel of the corresponding ATIP frame so as to store actual written data. But, the subcode data within every 98 EFM frames are used for storing associated information about the written data such as track numbers. In addition, the subcode data S0 of a first EFM frame F1 and the subcode data S1 of a second EFM frame F2 are used for generating a subcode synchronization signal. The subcode synchronization signal is used for determining synchronization between the EFM data that is prepared to be written and the ATIP data that is pre-recorded on the disk. In addition, when the optical disk recorder transfers the written data into EFM data, the optical disk recorder will simultaneously generate an encoder EFM frame synchronization (EEFS) signal corresponding to each ATIP frame, and an encoded subcode frame synchronization (ESFS) signal corresponding to each EFM frame. The EEFS signal and the ESFS signal are used for determining synchronization status of the written data when the written data are burned into the disk.

Figure 2:
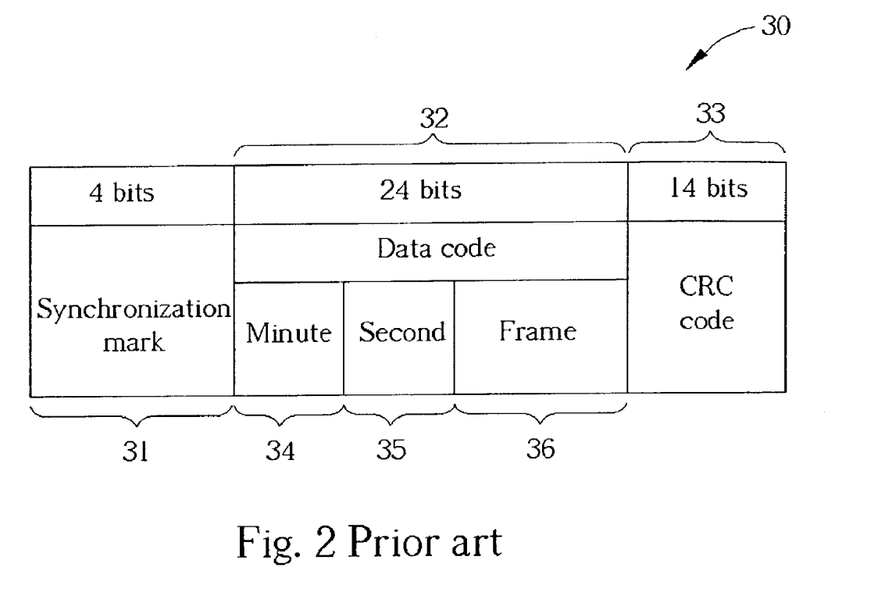
FIG. 2 is a diagram of prior art ATIP data.

Please refer to FIG. 2, which is a diagram of prior art ATIP data 30. When a recordable disk is manufactured, a wobbling track is formed on the surface of the recordable disk. After a pick-up head of the optical disk recorder senses the wobbling track, a wobble signal comprising waveforms with different frequencies is generated. The wobble signal is then decoded according to a frequency modulation (FM) for generating the ATIP data 30 that are related to the recording frames on the recordable disk. The ATIP data 30 are established by blocks. The bit length of each block is equal to 42. The ATIP data 30 has a synchronization mark 31 whose bit length is 4, a data code 32 whose bit length is 24, and a cyclic redundancy check (CRC) code whose bit length is 14. The data code 32 further has minute 34, second 35, and frame 36 information of the recording frame on the recordable disk.

Figure 3:
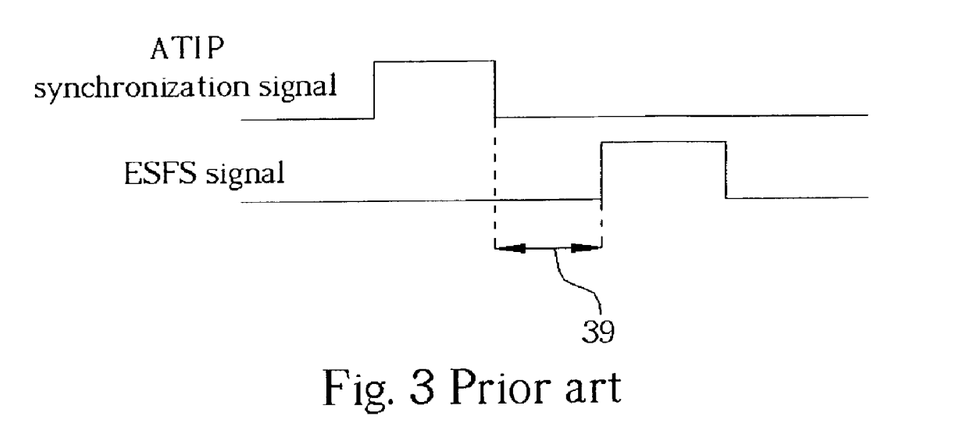
FIG. 3 is a diagram of the prior art ESFS synchronization signal and a prior art ATIP synchronization signal.

Please refer to FIG. 3, which is a diagram of the prior art ESFS synchronization signal and a prior art ATIP synchronization signal. The synchronization mark 31 of the ATIP data 30 corresponds to an ATIP synchronization signal. According to specification of the optical disk recorder, an error 39 between the ATIP synchronization signal and the ESFS synchronization signal must be controlled within an interval, that is, 2 recording frames of the disk. If the error 39 is greater than 2 recording frames, the recording process fails.

Figure 4:
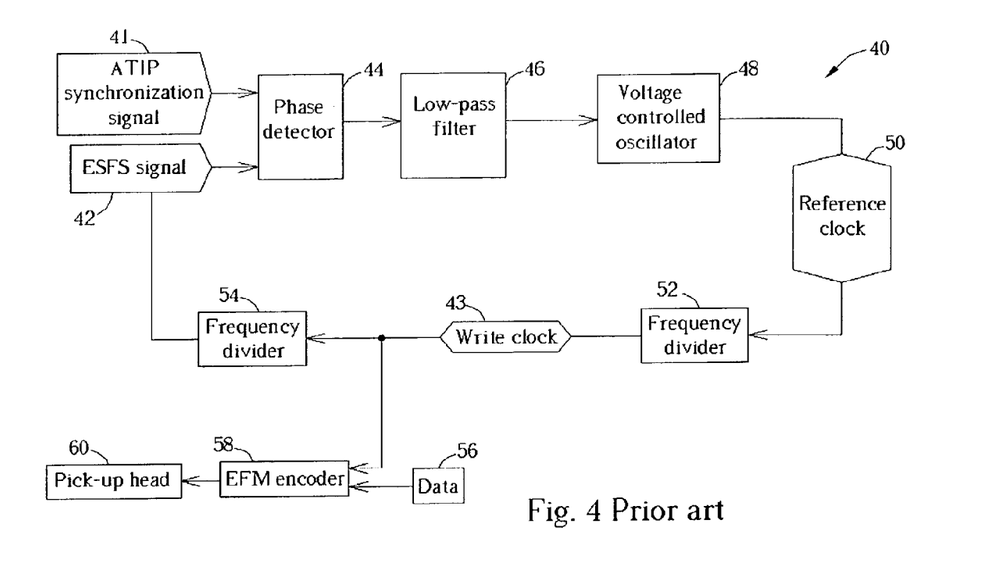
FIG. 4 is a block diagram of a write clock generator according to a prior art CAV optical disk recorder.

Please refer to FIG. 4, which is a block diagram of a write clock generator 40 according to the prior art CAV optical disk recorder. As mentioned above, the ATIP synchronization signal 41 and the ESFS signal 42 are used to determine whether the recordable disk is ready to record data. Under the CAV mode, the rotational speed of spindle is fixed so that the linear velocity at each position of the disk varies. In other words, the frequency of the wobble signal is unstable due to the frequency variation so that the frequency of the ATIP synchronization signal 41 is affected. In order to make the error between the ATIP synchronization signal 41 and the ESFS signal conform to the limitation defined by the specification, the write clock generator 40 is used for generating a write clock 43 so as to synchronize the ATIP synchronization signal 41 and the ESFS signal 42. A phase detector 44 will generate an output voltage according to a phase difference between the ESFS signal 42 and the ATIP synchronization signal 41. The output voltage is passed through a low-pass filter 46, and is transmitted to a voltage controlled oscillator (VCO) 48. The voltage controlled oscillator 48 then generates a reference clock 50 with a specific frequency according to the output voltage. The reference clock 50 is passed through a frequency divider 52, and a write clock 43 is outputted from the frequency divider 52. Furthermore, the write clock 43 is passed through another frequency divider 54 to alter the frequency of the ESFS signal 42. The above-mentioned process is repeated until the error between the ATIP synchronization signal 41 and the ESFS signal 42 complies with the required specification. That is, when the error between the ATIP synchronization signal 41 and the ESFS signal 42 meets the desired requirement according to the specification, the optical disk recorder can start burning data onto the disk. The write clock 43 is inputted to an EFM encoder 58 so that the EFM encoder 58 can transfer data 56 into a corresponding EFM data signal with the help of the write clock 43. The EFM data signals, which are synchronized with the write clock 43, are then transmitted to a pick-up head 60. Finally, the pick-up head 60 writes data 56 on the disk according to the received EFM data signal.

Based on the ATIP synchronization signal 41, the prior art write clock generator 40 of a CAV compact disk recorder uses a phase-lock loop (PLL) to lock the ESFS signal 42 and the related write clock 43. However, the ATIP synchronization signal 41 has a low frequency. For example, the ATIP synchronization signal 41 has a frequency equal to 75 hertz under "1x" recording speed. Therefore, the phase-lock process requires a long time to compare the phase difference and to adjust the corresponding frequency. That is, the write clock 43 will become stable only after a long period of time, meaning that the recording efficiency and stability of the optical disk recorder are greatly deteriorated.

SUMMARY OF INVENTION

It is therefore a primary objective of the claimed invention to provide a method that uses a wobble signal to generate a write clock of a constant angular velocity optical disk recorder so that the write clock achieves a stable state quickly to improve the recording quality and efficiency.

Briefly, the claimed invention provides a method for generating a write clock of an optical storage device. The optical storage device has a counter for generating a count number by using a reference clock to count a first signal, and a phase detector for generating an adjustment value by detecting a phase shift between a second signal and a frame synchronization signal. The method includes generating a rectification value according to the count number and the adjustment value, generating a reference write clock according to the rectification value and the reference clock, modifying the frame synchronization signal according to the reference write clock, and comparing the second signal with the frame synchronization signal. If the phase shift between the second signal and the frame synchronization signal is less than a predetermined value, the reference write clock is the write clock of the optical storage device.

It is an advantage of the claimed invention that the write clock generator uses a reference clock with a higher frequency to count the wobble signal for generating a count number, and generates a first reference synchronization signal based on the count number and the wobble signal. Because the frequency of the first reference synchronization signal is greater than the frequency of the ATIP synchronization signal, a lock time required by the corresponding phase-lock loop is greatly reduced, and a process time required for the write clock to be stable is reduced as well.

These and other objectives of the claimed invention will no doubt become obvious to those of ordinary skill in the art after reading the following detailed description of the preferred embodiment which is illustrated in the various figures and drawings.

DETAILED DESCRIPTION

Figure 5:
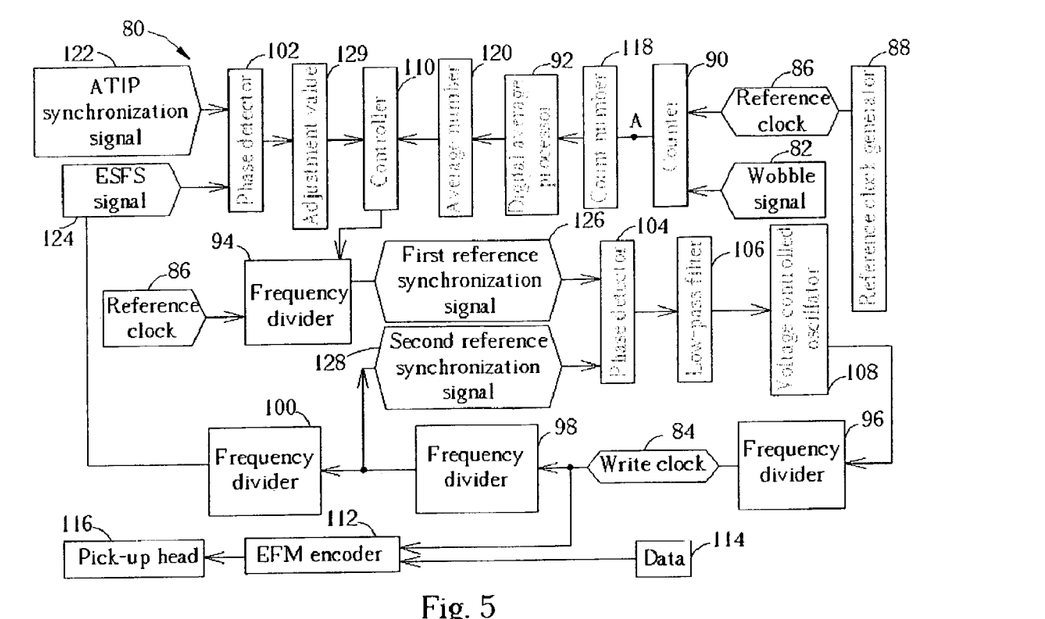
FIG. 5 is a block diagram showing a write clock generator of a CAV optical disk recorder according to the present invention.

Please refer to FIG. 5, which is a block diagram showing a write clock generator 80 of a CAV optical disk recorder according to the present invention. The present invention uses the wobble signal 82 to generate the write clock 84. The write clock generator 80 has a plurality of function blocks including a reference clock generator 88 for generating a reference clock 86, a digital average processor 92 for outputting an average number 120, a plurality of frequency dividers 94, 96, 98, 100 for changing frequencies of inputted signals, a plurality of phase detectors 102, 104 for comparing phases of different signals, a low-pass filter 106 for smoothing signals outputted from the phase detector 104, a voltage controlled oscillator 108 for generating a signal with a specific frequency according to an input voltage, and a controller 110 for controlling operation of the frequency divider 94.

The operation of the write clock generator 80 according to the present invention is described as follows. The reference clock generator 88 will output the reference clock 86 that has a fixed frequency. For example, the reference clock 86 could be a system clock of the optical disk recorder. Basically, the frequency of the reference clock 86 is fixed and is much higher than the frequency of the wobble signal 82. After the wobble signal 82 is retrieved from the recordable disk, the reference clock 86 and the wobble signal 82 are both passed to a counter 90. The counter 90 calculates a total number of reference periods (period of the reference clock 86) during one period of the wobble signal 82.

Figure 6:
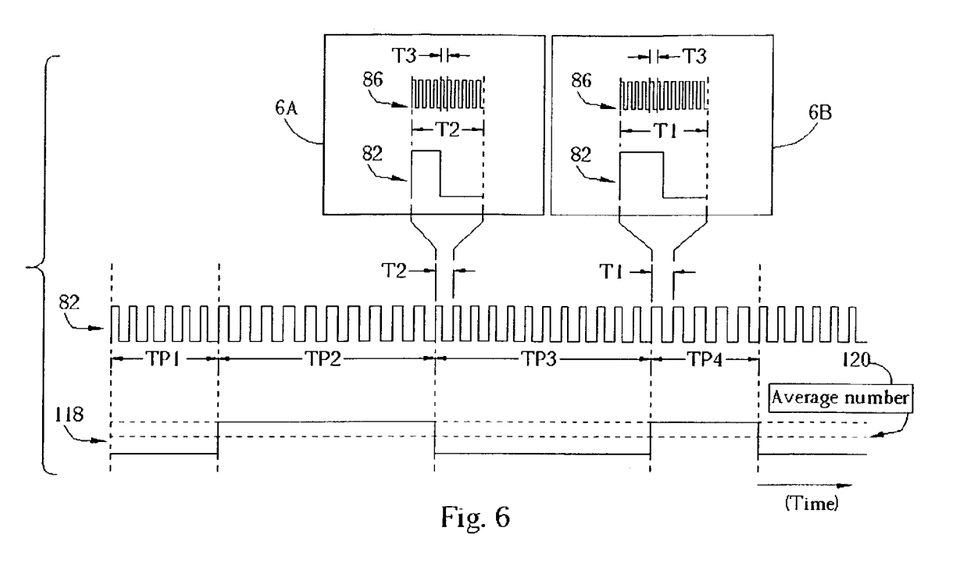
FIG. 6 is a diagram of a relation between the reference clock and the wobble signal.

Please refer to FIG. 6, which is a diagram of a relation between the reference clock 86 and the wobble signal 82. In FIG. 6, the horizontal axis represents time. Two waveforms shown in FIG. 6 represent the wobble signal 82 and a count number 118 outputted from the counter 90 at node A. As described above, the wobble signal 82 is established by two different waveforms, and each waveform has a specific frequency. As shown in FIG. 6, the wobble signal 82 has sectors TP2, TP4 with one frequency 1/T1 (period T1), and sectors TP1, TP3 with another frequency 1/T2 (period T2). When the counter 90 operates, the counter 90 uses reference period of the reference clock 86 as a unit to calculate the total number of reference periods during one period of the wobble signal 82. Please refer to FIG. 6A, which is detailed diagram of a period T2 associated with the wobble signal 82. Because the frequency of the reference clock 86 is greater than 1/T1 and 1/T2, the reference period T3 of the reference clock 86 is certainly shorter than the periods T1, T2 of the wobble signal 82. Therefore, the period T2 corresponds to a plurality of reference periods T3. Generally, the period T2 corresponds to hundreds of reference periods T3, but the actual number is determined by the frequency of the reference clock 86. Similarly, the period T1 of the wobble signal 82, as shown in FIG. 6B, corresponds to a plurality of reference periods T3 of the reference clock 86. After counting the number of reference periods in one period of the wobble signal 82, the counter 90 will output the count number 118 to the digital average processor 92. As the timing sequence of the count number 118 shows in FIG. 6, the number of reference periods T3 within one period T2 is less because the period T2 is shorter (high frequency). Therefore, the count number 118 corresponding to the sectors TP1, TP3 having the period T2 is less, too. On the contrary, the number of reference periods T3 within one period T1 is greater because the period T1 is longer (low frequency). Therefore, the count number 118 corresponding to the sectors TP2, TP4 having the period T1 is greater, too. Considering the count number 118, the sectors with regard to different frequencies correspond to different signal levels. In addition, the count number 118 generated from the counter 90 is then transmitted to the digital average processor 74 to calculate a long-term average of the count number 118, that is, to generate an average number 120. The related signal level of the average number 120 is also shown in FIG. 6 for clarity.

The frequency of the reference clock 86 is equal to the frequency of the wobble signal 82 times the average number 120. The controller 110, therefore, can adjust a dividing ratio of the frequency divider 94 according to the average number 120. In the preferred embodiment, the controller 110 adopts half the average number 120 as a fundamental dividing ratio of the frequency divider 94. In other words, without considering an additional factor, that is, an adjustment value 129 generated from the phase detector 102 to the controller 110, a first reference synchronization signal 124 that has a frequency doubling the frequency of the wobble signal 82 is generated when the reference clock 86 passed to the frequency divider 94. Moreover, the phase detector 102 will also generate the adjustment value 129 according to the phase difference between the ATIP synchronization signal 122 and the ESFS signal 124. The adjustment value 129 is used for further tuning the dividing ratio of the frequency divider 94. The controller 110, therefore, has to modify the dividing ratio of the frequency divider 94 according to a rectification value generated from both the average number 120 and the adjustment value 129. In addition, the phase detector 104 will output an output voltage according to a phase difference between the first reference synchronization signal 126 and a second reference synchronization signal 128. The output voltage is first passed through the low-pass filter 106, and then is transmitted to the voltage-controlled oscillator 108. The voltage-controlled oscillator 108 is used for generating a signal with a specific frequency according to the output voltage generated by the phase detector 104. The signal generated by the voltage-controlled oscillator 108 is further passed to a frequency divider 96 for generating a write clock 84. The write clock 84 is passed to a frequency divider 98 for generating the second reference synchronization signal 128, and the second reference synchronization signal 128 will further alter frequency of the ESFS signal 124. The above-mentioned process is repeated until the error between the ATIP synchronization signal 122 and the ESFS signal 124 conforms to an associated requirement defined in the specification of the optical disk recorder. That is, when the error between the ATIP synchronization signal 122 and the ESFS signal 124 meets the desired requirement according to the specification, the optical disk recorder can start burning data 114 onto the disk. The write clock 84 is inputted to an EFM encoder 112 so that the EFM encoder 112 can transfer data 114 into corresponding the EFM data signal with the help of the write clock 84. The EFM data signals, which are synchronized with the write clock 84, are then transmitted to a pick-up head 116. Finally, the pick-up head 116 writes data 114 into the disk according to the received EFM data signal.

In contrast to the prior art write clock generator, the claimed write clock generator uses a reference clock with a higher frequency to count the wobble signal for generating a count number, and generates a first reference synchronization signal based on the count number and the wobble signal. The first reference synchronization signal is used for locking a write clock and the ESFS signal. Because the frequency of the reference synchronization signal is greater than the frequency of the ATIP synchronization signal, a lock time required by the corresponding phase-lock loop is greatly reduced according to the claimed write clock generator, and a process time required for the write clock to be stable is reduced as well. Eventually, the efficiency and stability of the optical disk recorder is improved.

In other words, the present invention is a circuit for generating a write clock for controlling a writing sequence according to a reference clock, a wobble signal read from an optical disc, an ATIP synchronization signal and an ESFS signal in an optical storage device, the circuit comprise a counter, a first phase detector, a controller, a PLL circuit and a first frequency divider; wherein the counter for counting the wobble signal according to the reference clock to obtain an average count number; the first phase detector for generating an adjustment value by comparing a phase difference between the ATIP synchronization signal and the ESFS signal; the controller for generating a rectification value according to the adjustment value and the count number; the PLL circuit for synchronizing the ATIP synchronization signal and the ESFS signal; the first frequency divider connected to the controller and the PLL circuit for generating a write clock according to the rectification value from the controller and the reference clock if the phase difference between the ATIP synchronization signal and the ESFS signal is less than a predetermined value.

The reference signal can be a system clock of the optical storage device. The optical storage device can be a CD-RW drive. The optical storage device further comprises a digital average processor electrically connected to the counter for averaging count numbers outputted from the counter. The PLL circuit further comprises a second phase detector for comparing a phase difference between a first reference synchronization signal from the first divider and a second reference synchronization signal from the PLL circuit.

Those skilled in the art will readily observe that numerous modifications and alterations of the device may be made while retaining the teaching of the invention. Accordingly, the above disclosure should be construed as limited only by the metes and bounds of the appended claims.

What is claimed is:
1. A method for generating a write clock of an optical storage device, the optical storage device comprising:
a counter for generating a count number by using a reference clock to count a first signal; and
a phase detector for generating an adjustment value by detecting a phase shift between a second signal and a frame synchronization signal;

the method comprising:
generating a rectification value according to the count number and the adjustment value;
generating a reference write clock according to the rectification value and the reference clock;
modifying the frame synchronization signal according to the reference write clock; and
comparing the second signal with the frame synchronization signal;
wherein if the phase shift between the second signal and the frame synchronization signal is less than a predetermined value, the reference write clock is the write clock of the optical storage device.

2. The method of claim 1, wherein the first and second signals are both generated by a wobble signal.

3. The method of claim 2, wherein the first signal is the wobble signal, and the second signal is an absolute time in pre-groove (ATIP) synchronization signal.

4. The method of claim 3, wherein the counter uses the reference clock to count a half period of the wobble signal.

5. The method of claim 1, wherein the reference signal is a system clock of the optical storage device.

6. The method of claim 1, wherein the optical storage device is a CD-RW drive.

7. The method of claim 1, wherein the optical storage device further comprises a digital average processor electrically connected to the counter for averaging count numbers outputted from the counter.

8. The method of claim 1, wherein the frame synchronization signal is an encoded subcode frame synchronization (ESFS) signal.

9. An optical storage device operated under a constant angular velocity comprising:
a reference clock generator for generating a reference clock;
a counter for generating a count number by using a reference clock to count a first signal;
a phase detector for generating an adjustment value by detecting a phase shift between a second signal and a frame synchronization signal;
a controller for generating a rectification value according to the adjustment value and the count number; and
a frequency divider for generating a reference write clock according to the rectification value and the reference clock to further tune the frame synchronization signal;
wherein if the phase shift between the second signal and the frame synchronization signal is less than a predetermined value, the reference write clock is a write clock of the optical storage device.

10. The optical storage device of claim 9, wherein the first and second signals are both generated by a wobble signal.

11. The optical storage device of claim 10, wherein the first signal is the wobble signal, and the second signal is an absolute time in pre-groove (ATIP) synchronization signal.

12. The optical storage device of claim 11, wherein the counter uses the reference clock to count a half period of the wobble signal.

13. The optical storage device of claim 9, wherein the reference signal is a system clock of the optical storage device.

14. The optical storage device of claim 9, wherein the optical storage device is a CD-RW drive.

15. The optical storage device of claim 9, wherein the optical storage device further comprises a digital average processor electrically connected to the counter for averaging count numbers outputted from the counter.

16. The optical storage device of claim 9, wherein the frame synchronization signal is an encoded subcode frame synchronization (ESFS) signal.

17. A circuit for generating a write clock for controlling a writing sequence according to a reference clock, a wobble signal read from an optical disc, an ATIP synchronization signal and an ESFS signal in an optical storage device, the circuit comprising:
a counter for counting the wobble signal according to the reference clock to obtain an average count number;
a first phase detector for generating an adjustment value by comparing a phase difference between the ATIP synchronization signal and the ESFS signal;
a controller for generating a rectification value according to the adjustment value and the count number;
a PLL circuit for synchronizing the ATIP synchronization signal and the ESFS signal; and
a first frequency divider connected to the controller and the PLL circuit for generating a write clock according to the rectification value from the controller and the reference clock if the phase difference between the ATIP synchronization signal and the ESFS signal is less than a predetermined value.

18. The circuit of claim 17, wherein the reference signal is a system clock of the optical storage device.

19. The optical storage device of claim 17, wherein the optical storage device is a CD-RW drive.

20. The optical storage device of claim 17, wherein the optical storage device further comprises a digital average processor electrically connected to the counter for averaging count numbers outputted from the counter.

21. The optical storage device of claim 17, wherein the PLL circuit further comprises a second phase detector for comparing a phase difference between a first reference synchronization signal from the first divider and a second reference synchronization signal from the PLL circuit.

* * * * *

UNITED STATES PATENT AND TRADEMARK OFFICE
CERTIFICATE OF CORRECTION

| | | |
|---|---|---|
| PATENT NO. | : 7,016,277 B2 | Page 1 of 1 |
| APPLICATION NO. | : 10/248443 | |
| DATED | : March 21, 2006 | |
| INVENTOR(S) | : Chou et al. | |

It is certified that error appears in the above-identified patent and that said Letters Patent is hereby corrected as shown below:

On the title page item (54) and col. 1, line 1, change "METHOD AND DEVICE FOR GENERATING A WRITE CLOCK OF A CONSTANT ANGULAR VELOCITY OPTICAL DISK DEVICE" to --METHOD AND DEVICE FOR GENERATING A WRITE CLOCK OF A CONSTANT ANGULAR VELOCITY OPTICAL DISK DRIVE--

Signed and Sealed this

Seventeenth Day of October, 2006

JON W. DUDAS
*Director of the United States Patent and Trademark Office*